United States Patent [19]
Clement

[11] 3,942,780
[45] Mar. 9, 1976

[54] APPARATUS FOR SECURING A WORKPIECE TO BE MACHINED ON A MACHINE

[75] Inventor: Gilbert-Louis Clement, Semeac, France

[73] Assignee: Infranor S.A., Switzerland

[22] Filed: Sept. 16, 1974

[21] Appl. No.: 506,025

[30] Foreign Application Priority Data
Sept. 17, 1973   Switzerland................. 13331/73

[52] U.S. Cl. .................. 269/47; 269/78; 269/310; 269/321 A; 269/321 ME
[51] Int. Cl.[2] ......................................... B23Q 1/00
[58] Field of Search ............ 269/47, 74, 77, 78, 79, 269/81, 59, 289, 310, 321 A, 321 ME, 204

[56] References Cited
UNITED STATES PATENTS

| | | | |
|---|---|---|---|
| 832,087 | 10/1906 | Scoggins | 269/78 |
| 1,308,451 | 7/1919 | Schachat | 269/321 A |
| 2,360,417 | 10/1944 | Grenfell | 269/321 ME |
| 2,408,560 | 10/1946 | Keehn | 269/47 |
| 2,830,476 | 4/1958 | Zapf | 269/310 |
| 2,984,176 | 5/1961 | Sommer | 269/321 ME |
| 3,049,032 | 8/1962 | Schabot | 269/321 A |

*Primary Examiner*—Al Lawrence Smith
*Assistant Examiner*—Robert C. Watson
*Attorney, Agent, or Firm*—Robert E. Burns; Emmanuel J. Lobato; Bruce L. Adams

[57] ABSTRACT

A drilling or milling machine on which workpieces of thin metal plate can be accurately located for machining. The machine has a workplate to which is secured a table formed with openings in regular matrix array occupied by plates at least some of which are apertured. A workpiece is located on a rectangular workpiece support plate and clamped thereto. This workpiece support plate is formed with two bores each housing a spring loaded pin and each adjacent to an opposite corner of the workpiece support plate. The pins fit into the respective bores and into adjacent plate apertures of the matrix and are engaged by slotted plates which when moved in one sense pull the pins down against the spring loading to clamp the workpiece support plate and table together and when moved in the opposite sense allow the pins to release by the spring action so that the workpiece support plate can be removed. The matrix array comprising the apertured plates permits the workpiece support plate to be located in any of a number of predetermined positions, or a plurality of workpiece support plates each in a predetermined position.

13 Claims, 8 Drawing Figures

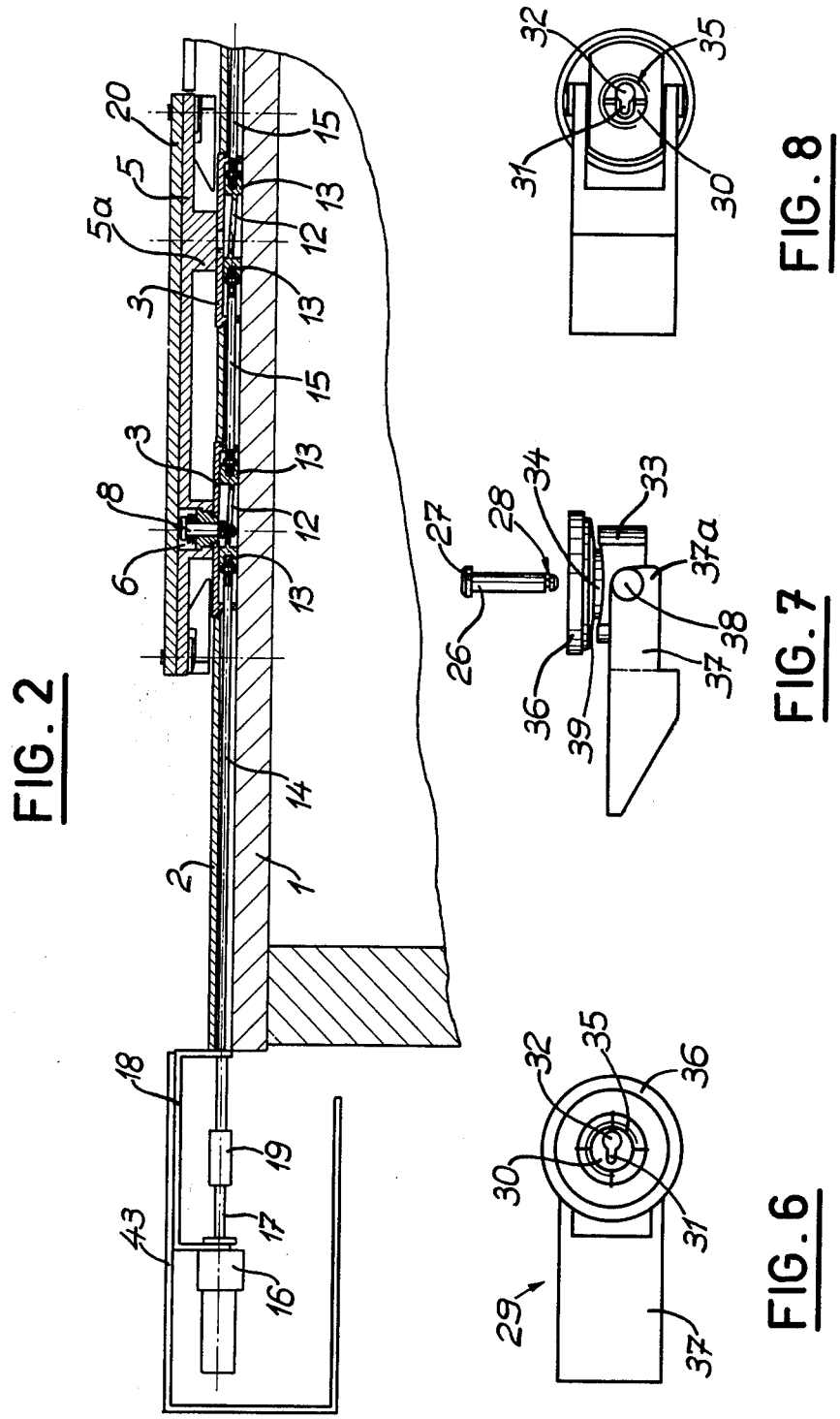

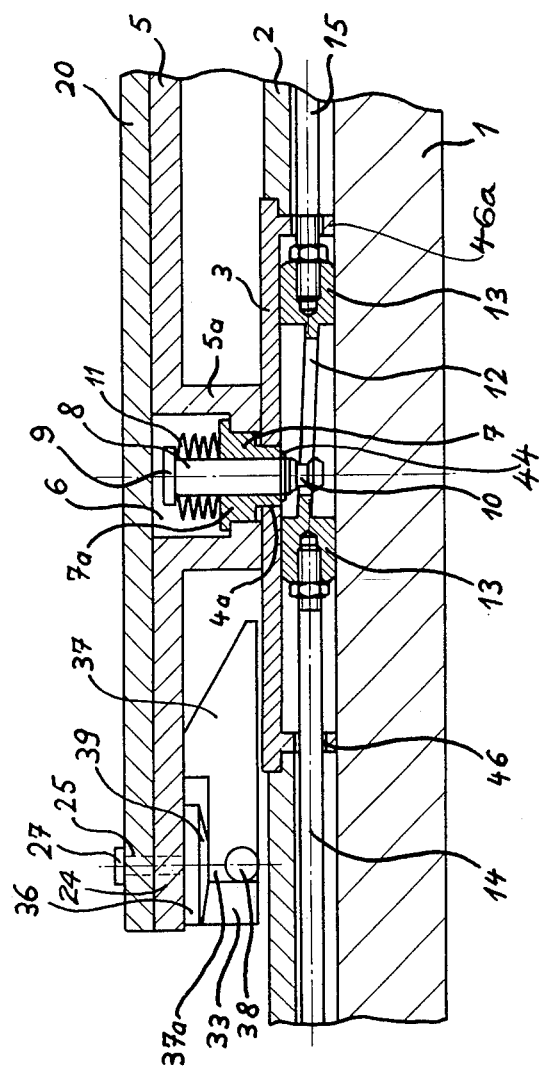
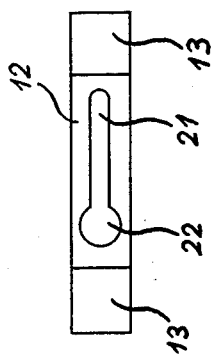

APPARATUS FOR SECURING A WORKPIECE TO BE MACHINED ON A MACHINE

BACKGROUND OF THE INVENTION

The invention relates to an arrangement for securing a workpiece to be machined on a tool machine.

It is the object of the invention to provide an arrangement such that the workpieces to be machined, in particular with drilling or milling tools, may be secured to the machine quickly and in an accurately adjusted manner and may be removed from the machine in the shortest time after machining and replaced by new workpieces to be machined, so that a very economical series production of large quantities is possible. In particular, it is the purpose of the arrangement according to the invention to simplify and accelerate the series machining of thin plate-like workpieces, for example of printed circuits, for which the problem of rapid and accurate attachment to a machine tool has hitherto not been solved in an optimum manner.

SUMMARY OF THE INVENTION

Based on an arrangement of the aforedescribed type, the invention for fulfilling this object comprises a table which may be interchangeably secured to a workplate and is provided with a number of openings, and at least one workpiece support plate interchangeably located on this table and on which workpiece support plate the workpiece may be fixed. The workpiece support plate comprises at least two locking pins, each axially displaceable in a bore in the plate against the action of a spring, which pins engage in two of the said openings in the table. Adjustable locking plates are located below the table surface in the region of the openings, co-operating with the inner or lower ends of the locking pins, which locking plates, when shifted in one direction, draw the locking pin into the opening against the action of the spring and thus press the workpiece support plate with resilient force against the table. When shifted in the opposite direction the locking plates enable the springs to or raise the locking pins and thus to unlock The workpiece support plate.

Further features of the invention will become apparent from the subsequent description.

By means of the arrangement according to the invention, it is achieved that the interchangeable workpiece support plates, to which the workpieces to be machined can be removably secured remotely of the machine tool, need solely to be located on the table, by engaging their locking pins in openings in the table and then the locking plates need to be brought into their locked position, whereby a rapid and accurate attachment of the workpiece support plate to the table is ensured.

For the removable securing of thin, plate-like workpieces, such as printed circuits in particular, to a workpiece support plate and to facilitate the machining of the workpieces, special clamping members are preferably provided. Each of them comprises a locking plate, engaging a section of a securing pin penetrating the workpiece and the workpiece support plate and projecting on the underside of the workpiece support plate the clamping member being tightened so that the securing pin is drawn downwards through this locking plate. Substantially, the entire clamping member is located underneath the workpiece support plate, so that upper the surface of the thin plate-like workpiece to be machined, on which solely the head of the securing pin bears, is freely accessible.

BRIEF DESCRIPTION OF THE DRAWINGS

One embodiment of the invention is illustrated in detail in the drawings:

FIG. 2 is a partial view of a section on line II—II of FIG. 1, drawn to an enlarged scale, with a workpiece clamped on one of the workpiece support plates;

FIG. 3 is a section through the region of a locking pin in the illustration according to FIG. 2, drawn to a more enlarged scale;

FIG. 5 is a view of a locking plate;

FIG. 6 is a plan view of a clamping member for securing a thin plate-shaped workpiece to one of the workpiece support plates;

FIG. 7 is a side view of this clamping member according to FIG. 6, also showing a clamping pin; and FIG. 8 is an underneath view of the clamping member according to FIG. 6 and 7. According to FIGS. 1 and, 2 and 3, the machine comprises a workplate 1, a table 2,3 attached to and slightly spaced above this workplate by screws 40 and adjustment pins 41, and four workpiece support plates 5 located on the table 2,3. Plates 5 are each supported on the table by four feet 5a. The tools as well as their supports and heads, which are located above the workpiece support plates, are not shown in the drawings but it will be understood that the machine may be a combined drilling and milling machine, in which at least two tool heads are movable firstly in longitudinal direction of the workplate and secondly at right angles thereto in transverse direction of the workplate. For this purpose, opposing vertical supports may be provided on both longitudinal sides of the table, which supports engage on their underside with an angular projection under the workpiece and are guided on longitudinal rails at this point. Attached to the upper end of both supports may be a cross-bar spanning the working plate, on which two tools heads, located on both sides of this cross-bar, are displaceably mounted for example. To move the tools in longitudinal direction of the workplate, the aforementioned supports are moved on their rails, whereas for the transverse movement of the tool heads, the latter are moved along the cross-bar. In this manner, the entire surface of the workplate is available for unhampered machining of workpieces.

Figure 1:
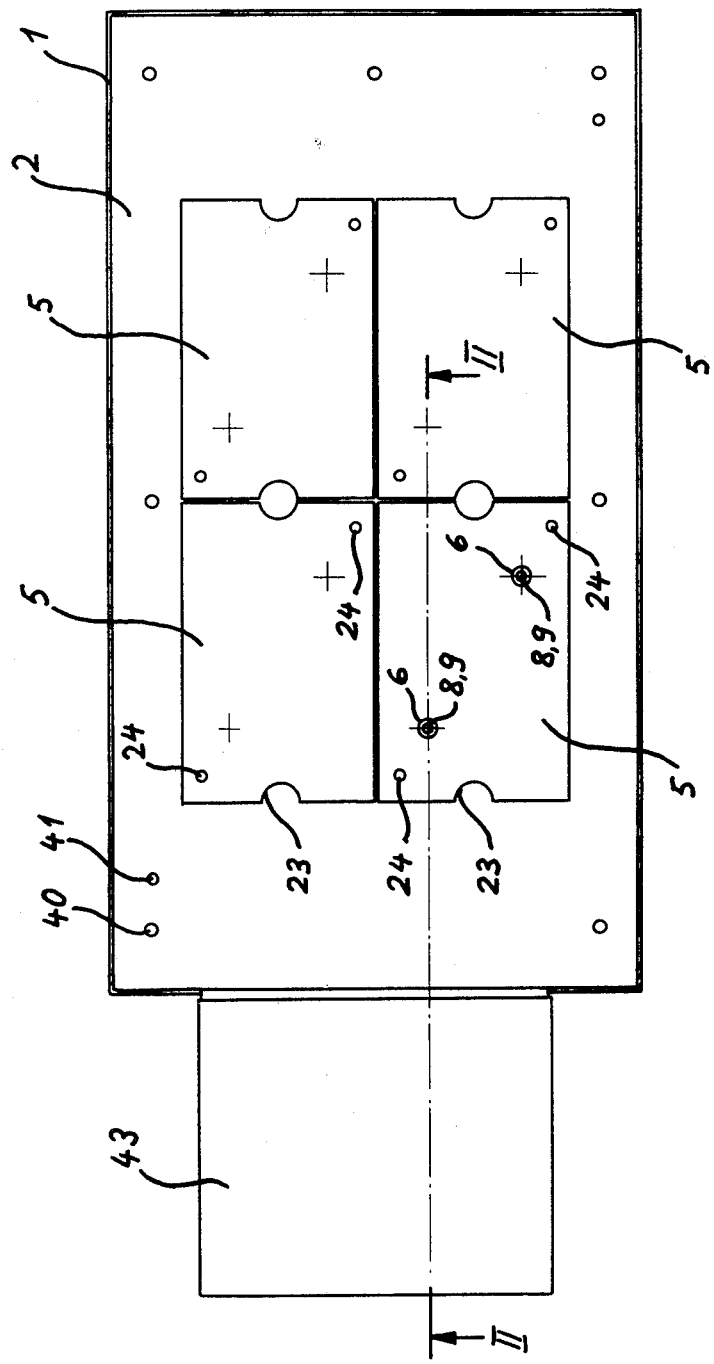
FIG. 1 is a plan view of the machine with four workpiece support plates thereon.
Figure 4:
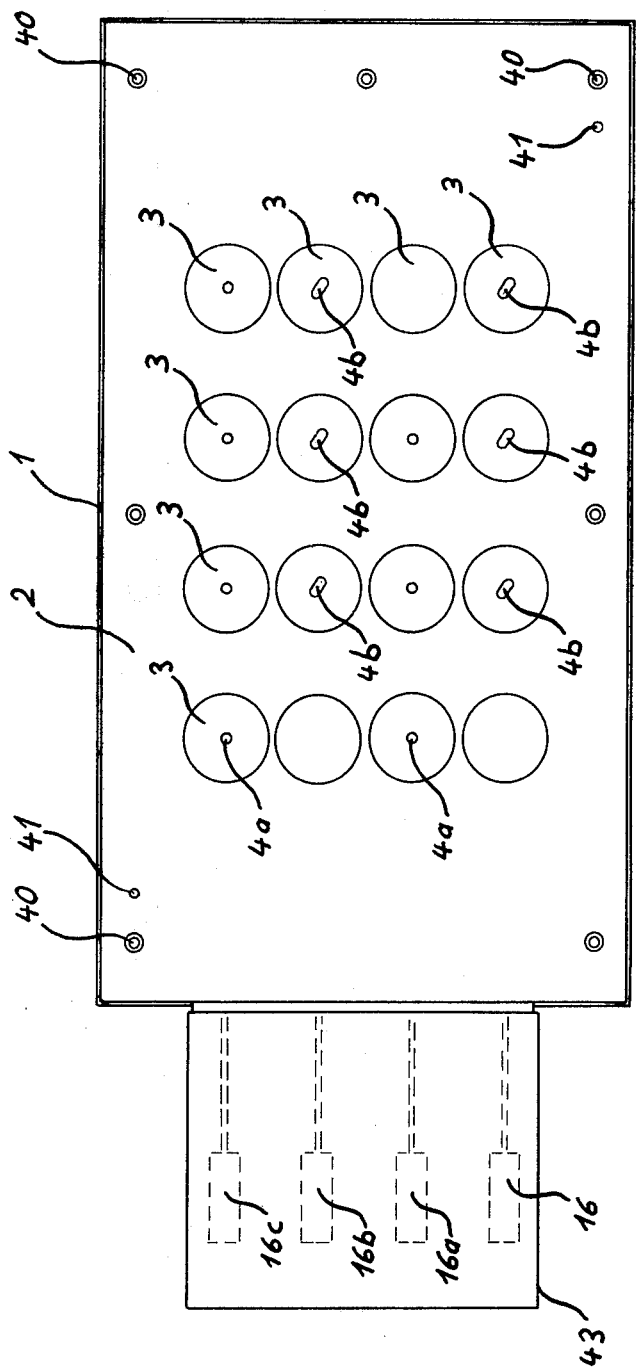
FIG. 4 is a plan view of the table according to FIG. 1, omitting the workpiece support plates.

According to FIGS. 1 and 4, the table consists of a rectangular baseplate 2 with uniformly arranged circular recesses and of circular plate 3 inserted in these recesses, which plates are preferably secured by forcing in and/or by sticking. In the example according to FIG. 4, seven securing screws 40 and two adjustment pins 41 as well as four rows each of four circular recesses with circular plates 3 inserted therein are provided. Openings 4a, 4b are provided in the centre of these circular plates 3 and in particular, the circular plates of the first and third row have round holes 4a and those of the second and fourth row have slots 4b. The longitudinal axis of each slot is inclined with respect to the rows and intersects the centre of the round hole 4a in the diagonally staggered circular plate of a neighbouring row. In this manner, each round aperture 4a defines the exact location of one point of plate 5 relative to table 2, and each slot 4b defines the exact alignment of the entire plate 5, without critical dependence on the exact distance between the centers of corresponding openings or bores in the plate. Each pair of diagonally adjacent openings, i.e. a slot 4b and a round hole 4a, serves for securing a workpiece support plate 5, which is provided with a pair of stepped bores 6 for this purpose according to FIGS. 1 and 2, which penetrate two diagonally opposed feet 5a. The centre to centre spacing of the stepped bores 6 is equal to the centre to centre spacing of the openings 4a, 4b of two diagonally adjacent circular plates 3 of the table. As shown in the drawing, feet 5a are spaced from the edges of the respective workpiece support plates 5.

According to FIG. 1, up to four workpiece support plates 5 can be arranged side-by-side in the form of a rectangle, as illustrated in FIG. 1. According to FIG. 4, those circular plates 3 which are not used for the type of attachment in question have no apertures.

According to FIG. 3, a centering bush 7, preferably of heat-treated steel is inserted in each stepped bore 6 of a workpiece support plate 5, which bush bears with an upper annular flange 7a on a corresponding annular edge of the stepped bore 6. A peripheral section of bush 7 projecting downwards from the stepped bore, engages in the respective opening 4a or 4b; as shown in FIG. 3, it engages in a round hole 4a in the table 2,3. The exact outer diameter of the centering bush guarantees an accurately adjusted position of the workpiece support plate 5 on the table 2,3. A locking pin 8 axially inserted in the stepped bore 6 and penetrating the centering bush 7, projects, with its inner or lower end, which is provided with an annular groove 10, into the space below the circular plate 3 locking pin 8 with its head 9 against one end of a helical spring 11, which surrounds the pin 8 above the centering bush 7 and bears with its lower end on the upper side of this centering bush 7. Located in the space below the circular plate 3, (which plate, as shown, bears with its lower annular flange 46a on the workplate 1), is a locking plate 12, which is movable parallel to the table surface. The locking plate is disposed slanting somewhat obliquely relative to the table surface and has a slot 21, which has an enlarged recess 22 at its end adjacent the table surface (FIG. 5). This enlarged recess 22 is dimensioned such that in the unlocked position of the locking plate 12 illustrated in FIGS. 2 and 3, the inner end of the locking pin 8 may engage freely in this recess. Thus, in this position, the workpiece support plate 5 with its locking pin 8 may be placed on the table 2,3 in suitably adjusted position, with the inner ends of the pins engaging in these recesses 22. Now if the locking plate 12 is moved towards the left in the illustration according to FIGS. 2 and 3, the edges of the slot 21 come into engagement with the annular groove 10 on the inner end of the locking pin 8 and draw the latter downwards against the action of the spring 11, owing to the inclined orientation of the locking plate 12; thus, the workpiece support plate 5 is pressed and locked against the table surface against the elastic force of the spring 11.

Each locking plate 12 is integral with two blocks or slides 13 located at its ends, which are guided between the surface of the workplate 1 and the underside of the circular disc 3. Attached to the left-hand slide 13 (FIG. 2) is an axially displaceable actuating rod 14 located underneath the table 2,3, which is guided in a radial aperture 46 in the annular flange 46a of the circular plate 3 and whose other end is connected by a coupling 19 to the piston 17 of a pneumatic cylinder 16. This pneumatic cylinder 16 is attached by means of a frame 18 to one narrow side of the workplate 1. All the locking plates 12 associated with the openings 4a or 4b arranged in a row, are attached (according to FIG. 2) by connecting rods 15, whose ends are attached to the adjacent slides 13 of adjacent locking plates 12 and may therefore be simultaneously displaced by the associated pneumatic cylinder 16. Therefore, only one pneumatic cylinder 16 needs to be associated with each row of openings 4a, 4b in the table 2,3, i.e. in the embodiment in question, there are four cylinders 16,16a,16b and 16c, which are shown in FIG. 4 and located in a common housing 43. Therefore, if the four workpiece support plates 5, provided with the workpieces 20 to be machined (FIG. 2), have been placed on the table 2,3, as described, with the inner ends of the locking pins 8 engaged in the corresponding recesses 22 in the locking plate 12, only the pneumatic cylinders need to be actuated for moving all the locking plates 12 into their locked position. After the completion of the machining operation, the locking plates 12 are returned to the unlocked position illustrated in FIG. 2, by the pneumatic cylinders, the locking pins 8 being raised and then released, so that the workpiece suport plates 5 can be removed from the table 2,3. In order that during the handling of the workpiece support plates 5, the locking pins 8 are undetachably retained on the latter, a securing ring or clip 44 is provided in the lower region of the locking pin 8 between its annular groove 10 and the centering bush 7.

As shown in FIG. 1, each workpiece support plate 5 has semi-circular recesses 23 on opposing edges thereof, located so as to face one another on mutually adjacent workpiece support plates and thereby to provide access to the space between these plates and the table 2.

Clamping means 29 are provided for securing a thin, plate-like workpiece 20 to a workpiece support plate 5, in particular for securing a printed circuit or several printed circuits lying one above the other to be machined at the same time, which means are illustrated in FIGS. 2 and 3 in their locked operating position and are shown in more detail in FIGS. 6 to 8. Each of these clamping means, whereof at least two are used for securing one workpiece plate 20, comprises a locking or clamping plate 30, which has an external screwthread and is screwed by this thread in the corresponding internal screwthread 35 of a locking plate housing in the form of a sleeve 33, of a vertically perforated disc 36 serving as a support of sleeve 33 and, being mounted with axial clearance on an upper axial tubular projection 34 this sleeve 33, with the interposition of a spring plate 39; and an eccentric lever 37, which is pivoted to a lower region of the sleeve 33. For this pivoting, the inner section of the eccentric lever 37 is constructed in the form of a fork, whose arms surround diametrically opposed flattened regions of the sleeve 33 and at this point are pivoted thereto by means of pins, which form the articulation 38. As shown in FIG. 3, the locking plate 30, sleeve 33, disc 36, spring 39 and lever 37 are located in the space between the workpiece support plates 5 and table 2. The locking plate 30 consists of a disc provided with a transverse slot 31 for introducing a screw-driver, which slot widens out at one end to form an enlarged round hole 32. The locking plate 30 co-operates with the lower end of a securing or fastening pin 26, which is inserted in aligning holes 24,25 of the workpiece 20 and workpiece support plate 5 and bears with its head 27 on the workpiece 20. The end of the securing pin 26 projecting from the underneath of the workplate support plate 5 may be freely inserted in the round hole 32 in the locking plate 30 and is provided with an annular groove 28, in which, on a corresponding displacement of the clamping member 29 with the locking plate 30, the longitudinal edges of the slot 31 in the locking plate engage for the purpose of locking the securing pin.

The eccentric lever 37 may be tilted through 180°. The lever position swung through 180° with respect to the locked position according to FIG. 2, forms the unlocked position and is illustrated in FIG. 7. In this unlocked position, the part 37a of the eccentric lever 37, which is eccentric relative to the articulation 38, is located on the side of the articulation 38 remote from the perforated disc 36. For using the clamping member 29, this member is pushed upwardly on the lower end of the securing pin 26, underneath the workpiece support plate 5, so that the pin extends through the locking plate 30, this securing pin firstly engaging in the round opening 32 and then, after a slight lateral displacement of the clamping member 29, engaging with its annular groove 28 in the slot 31. Now, the eccentric lever 37 is tilted through 180° for the purpose of locking. The eccentric part 37a of the lever then presses against the spring plate 39 and thus, under the tension of this spring plate 39, the perforated disc 36 is pressed against the underside of the workpiece support plate 5 and the securing pin 26 retained in the slot 31 of the locking plate 30 is drawn downwards. In this manner, the workpiece plate 20 and the workpiece support plate 5 are clamped against each other with resilient force between the head 27 of the securing pin 34 and the perforated disc 36. For this purpose, as seen in FIGS. 6 to 8, the diameters of the spring plate 39 and perforated disc 36 are so much greater than the spacing between the lever arms pivoted to the sleeve 33 or the diameter of the sleeve 33 in the region of the articulation that the spring plate and perforated disc project beyond the eccentric region 37a of the eccentric lever 37.

To adapt the clamping member 29 to the thickness of the workpiece plate 20 to be machined or several workpiece plates 20 located one above the other and to be machined at the same time, the spacing between the head 27 of the securing pin 26 and the locking plate 30 in the operating position of the clamping member 29 is simply adjusted. For this purpose locking plate 30 is appropriately screwed in the sleeve 33 and thus the axial spacing of the locking plate 30 relative to the sleeve 33 is varied. This may be simply undertaken with a screwdriver inserted in the transverse slot 31 of the locking plate 30. The perforated disc 36 and thus the spring plate 39 are undetachably retained on the sleeve 33 by the edge, which is flanged somewhat towards the outside, on the end of the projection 34 of the sleeve 33.

With few operations, which can be carried out quickly, the arrangement according to the invention makes it possible, on the one hand, to fix a workpiece 20, in particular a plate-like printed circuit, in a definite manner on a workpiece support plate 5, or to replace a machined workpiece 20 by the next workpiece plate to be machined and, on the other hand, to secure or exchange a workpiece support plate 5 with the workpiece 20 fixed thereon, to the table 2,3 in an accurate manner. The exchange of a workpiece support plate 5 may be carried out in approximately 5 seconds and the attachment of a plate-like workpiece 20 to a workpiece support plate 5 may be carried out in 10 seconds at the maximum. It is thus readily possible to achieve an accuracy of 35 2/100mm for positioning a workpiece 20 on a workpiece support plate 5, which may have dimensions of 300 × 300mm for example. The described clamping means facilitate the attachment of workpieces 20 or a set of workpiece located one above the other, in particular printed circuits, whose thickness may vary between 0.8mm and 8mm for example, according to the length of the screwthread 35 of the sleeve 33. By choosing an appropriate spring plate 39 or helical spring 11, optimum contact forces may be achieved.

In addition, owing to the arrangement of the circular plates 3 with their openings 4a,4b, it is possible, in place of four workpiece support plates 5, to provide only one workpiece support plate on the central region of the table 2,3 or two workpiece support plates in the centre of the table, located one beside the other in the transverse direction of the latter. If it is intended not to machine plate-like workpieces, but workpieces of any other shape, then the table 2,3 on the workplate 1 may be simply replaced by another appropriately constructed table, which comprises bores arranged uniformly in the form of a matrix, as attachment points for the workpieces for example, the inner regions of which bores are provided with a screwthread for the purpose of screwing in a securing member.

I claim:

1. Apparatus for securing and registering a workpiece with respect to a tool machine, comprising;
    a tool machine table having a plurality of openings; a workpiece support plate disposed on and parallel to the table and having a plurality of bores at locations matching those of the openings of the table; means for interchangeably securing the workpiece support plate to the table to secure a workpiece thereto, comprising, a plurality of locking pins each axially displaceable in one of the bores in the workpiece support plate and downwardly into and through one of the openings in the table and having a lower portion with an annular groove below the table, a spring for each locking pin disposed above the table to bias the pin upwardly;
    a locking plate for each locking pin, disposed below the table in the region of the respective opening, slanting in a predetermined direction relative to the table and having a slot extending in said direction whose edges can engage the annular groove of the locking pin, said slot having an enlarged portion adjacent the table for releasing the locking pin, each locking plate having slide means rigid therewith and disposed to guide the plate along the underside of the table, and a rod secured to said slide means, below the table for reciprocably sliding the plate in said direction between a first position in which the respective locking pin has its lower end in the enlarged portion of the slot and a second position in which the groove of the pin is engaged by the edges of the slot and the pin is drawn down against the bias of the spring; and
    actuator means lateral of the workpiece support plate for axially, reciprocably moving the rods to move the locking plates along the underside of the table, thereby to move the locking pins in directions through the workpiece support plate and thus to interchangeably secure the workpiece support plate to the table.

2. Apparatus according to claim 1, in which a plurality of the locking plates are aligned with one another and disposed to be moved together by one of the rods and actuator means.

3. Apparatus according to claim 1 including centering bushes, each having one of the bores of the workpiece support plate extending therethrough and each having an annular flange engaging said plate around the respective bore, a lower portion of each bush engaging in a respective opening of the table, and the spring of each locking pin bearing against the respective centering bush for the upward biasing of the locking pin.

4. Apparatus according to claim 1, in which the table comprises means defining the openings in the table, including a round hole and a slot whose longitudinal axis intersects the round hole.

5. Apparatus according to claim 1, in which the table comprises means defining additional openings, arranged in parallel rows of round holes and of slots, alternating with each other, the longitudinal axis of each slot extending obliquely with respect to the rows and intersecting a round hole of an adjacent row.

6. Apparatus according to claim 1, in which the table comprises a base-plate having a plurality of circular recesses, and a circular plate in each recess, whereof at least some are apertured, each apertured plate having one of said openings at its center.

7. Apparatus according to claim 6, wherein each circular plate has an annular flange extending downwardly therefrom, each of said rods extending through the respective flange.

8. Apparatus according to claim 1, including additional woripiece support plates uniformly interchangeably secured to the tool machine table.

9. Apparatus according to claim 8, in which every workpiece support plate has four feet spaced from its edges and resting on the table, whereof at least two feet have said bores and said locking pins therein.

10. Apparatus according to claim 8, wherein each workpiece support plate has recesses on mutually opposite edges thereof, facing one another on mutually adjacent workpiece support plates.

11. Apparatus according to claim 1, including means for securing a plate-shaped workpiece to the workpiece support plate, comprising fastener pins extending through said plate and the workpiece, each fastener pin having a head engaging the workpiece and having means on the underside of the workpiece support plate for clamping the pin, and thereby the workpiece, to said support plate.

12. Apparatus according to claim 11, in which the clamping means includes a clamping plate disposed below the workpiece support plate, parallel to it and having a locking slot, the fastener pin having an annular groove on its lower end engageable with said locking slot and that slot having an enlarged opening at one end, into which the lower end of the pin can be freely inserted; lever means tiltable relative to and mounted on the clamping plate for resiliently clamping the fastener pin and the workpiece to the workpiece support plate; and a spring plate located between the clamping plate and the lever to provide said resilient clamping.

13. Apparatus according to claim 10, including means for adapting the workpiece securing means to the thickness of the plate-shaped workpiece, comprising means for holding the clamping plate to the workpiece supporting plate with adjustable spacing therebetween.

* * * * *